United States Patent
Kim et al.

(10) Patent No.: US 11,222,860 B2
(45) Date of Patent: Jan. 11, 2022

(54) SEMICONDUCTOR DEVICE INCLUDING STACKED SUBSTRATE AND METHOD OF FABRICATING THE SEMICONDUCTOR DEVICE

(71) Applicant: SK hynix Inc., Icheon-si (KR)

(72) Inventors: Ki Bum Kim, Icheon-si (KR); Jong Hoon Kim, Suwon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 17/073,009

(22) Filed: Oct. 16, 2020

(65) Prior Publication Data

US 2021/0366856 A1 Nov. 25, 2021

(30) Foreign Application Priority Data

May 25, 2020 (KR) .......................... 10-2020-0062611

(51) Int. Cl.
*H01L 23/00* (2006.01)
*H01L 23/48* (2006.01)
*H01L 23/532* (2006.01)
*H01L 21/768* (2006.01)
(Continued)

(52) U.S. Cl.
CPC ........ *H01L 24/08* (2013.01); *H01L 21/76831* (2013.01); *H01L 21/76852* (2013.01); *H01L 21/76898* (2013.01); *H01L 23/481* (2013.01); *H01L 23/5329* (2013.01); *H01L 23/53238* (2013.01); *H01L 24/05* (2013.01); *H01L 24/80* (2013.01); *H01L 25/0657* (2013.01); *H01L 25/50* (2013.01); *H01L 2224/05124* (2013.01); *H01L 2224/05147* (2013.01); *H01L 2224/08146* (2013.01); *H01L 2224/80895* (2013.01); *H01L 2224/80896* (2013.01); *H01L 2225/06541* (2013.01)

(58) Field of Classification Search
CPC ....... H01L 21/76831; H01L 2224/0401; H01L 21/76898; H01L 23/53295; H01L 24/08; H01L 23/5329; H01L 24/80; H01L 23/481; H01L 21/76852; H01L 23/53238; H01L 24/05; H01L 25/0657; H01L 25/50
See application file for complete search history.

(56) References Cited

U.S. PATENT DOCUMENTS 9,991,244 B2 6/2018 Lin
10,068,867 B2 9/2018 Chiu et al.
10,840,190 B1 * 11/2020 Yang ..................... H01L 23/481
(Continued)

*Primary Examiner* — Mamadou L Diallo
(74) *Attorney, Agent, or Firm* — William Park & Associates Ltd.

(57) ABSTRACT

A semiconductor device includes a second semiconductor substrate vertically stacked on a first semiconductor substrate. The first semiconductor substrate includes a first diffusion barrier layer covering a first surface of a first semiconductor substrate body, and a first through via having a third surface exposed to a second surface of the first diffusion barrier layer. The second semiconductor substrate includes a second semiconductor substrate body, a second diffusion barrier layer directly bonded to a surface of the first diffusion barrier layer, and a front pad having a smaller surface area than the third surface of the first through via and directly bonded to the third surface of the first through via.

20 Claims, 11 Drawing Sheets

(51) Int. Cl.
 H01L 25/00 (2006.01)
 H01L 25/065 (2006.01)

(56) References Cited

U.S. PATENT DOCUMENTS

| | | | |
|---|---|---|---|
| 10,867,970 B2* | 12/2020 | Seo | H01L 25/0657 |
| 2014/0035158 A1* | 2/2014 | Chang | H01L 24/92 |
| | | | 257/774 |
| 2014/0117546 A1* | 5/2014 | Liu | H01L 21/76834 |
| | | | 257/751 |
| 2014/0225277 A1* | 8/2014 | Chang | H01L 23/481 |
| | | | 257/774 |
| 2016/0190103 A1* | 6/2016 | Kabe | H01L 23/5329 |
| | | | 257/777 |
| 2021/0057371 A1* | 2/2021 | Park | H01L 27/307 |
| 2021/0084249 A1* | 3/2021 | Nakazawa | H01L 25/167 |
| 2021/0134747 A1* | 5/2021 | Yang | H01L 24/03 |

* cited by examiner

SEMICONDUCTOR DEVICE INCLUDING STACKED SUBSTRATE AND METHOD OF FABRICATING THE SEMICONDUCTOR DEVICE

CROSS-REFERENCE TO RELATED APPLICATIONS

The present application claims priority under 35 U.S.C 119(a) to Korean Application No. 10-2020-0062611, filed on May 25, 2020, which is incorporated herein by references in its entirety.

BACKGROUND

1. Technical Field

The present disclosure generally relates to a semiconductor packaging technology and, more particularly, to a semiconductor device including stacked substrates and a method of fabricating the semiconductor device.

2. Related Art

Semiconductor devices are used in various electronic applications. The semiconductor devices can be used for personal computers, mobile phones, cameras, and the like. The semiconductor devices can be fabricated by processes of depositing a semiconductor material layer, a conductive layer, a dielectric layer or an insulating layer on a semiconductor substrate or semiconductor wafer and patterning those layers to form circuit components and elements, and processes of separating the semiconductor substrate or wafer into individual dies and packaging the individual dies into packages.

As the integration densities of various electronic components such as transistors, capacitors, and diodes increase and smaller packages are required, three-dimensional (3D) semiconductor devices have been recently developed. The 3D semiconductor devices have been developed in a package form such as a package on package (POP) or a system in package (SIP).

SUMMARY

An aspect of the present disclosure presents a semiconductor device including a first semiconductor substrate, and a second semiconductor substrate vertically stacked on the first semiconductor substrate.

The first semiconductor substrate may include a first semiconductor substrate body, a first diffusion barrier layer covering a first surface of the first semiconductor substrate body, and a first through via having a third surface exposed to a second surface of the first diffusion barrier layer.

The second semiconductor substrate may include a second semiconductor substrate body disposed on the first semiconductor substrate body; a second diffusion barrier layer covering a fourth surface of the second semiconductor substrate body, facing the first semiconductor substrate body, a portion of a fifth surface being directly bonded to the second surface of the first diffusion barrier layer; and a front pad having a sixth surface exposed to the fifth surface of the second diffusion barrier layer, the sixth surface having a smaller surface area than the third surface of the first through via and being directly bonded to the third surface of the first through via of the first semiconductor substrate.

An aspect of the present disclosure presents a semiconductor device including a first semiconductor substrate, and a second semiconductor substrate vertically stacked on the first semiconductor substrate.

The first semiconductor substrate may include a first semiconductor substrate body, a first diffusion barrier layer covering a first surface of the first semiconductor substrate body, and a first through via having a third surface exposed to a second surface of the first diffusion barrier layer.

The second semiconductor substrate may include a second semiconductor substrate body disposed on the first semiconductor substrate body; a second diffusion barrier layer covering a fourth surface of the second semiconductor substrate body, facing the first semiconductor substrate body, and having a fifth surface partially and directly bonded to the second surface of the first diffusion barrier layer; a front pad having a sixth surface and bonded to the third surface of the first through via, the sixth surface exposed to the fifth surface of the second diffusion barrier layer having a smaller surface area than the third surface of the first through via; and a second through via electrically connected to the front pad and penetrating the second semiconductor substrate body.

In a method of fabricating a semiconductor device according to an aspect of the present disclosure, a second semiconductor substrate may be stacked on a first semiconductor substrate. The method of fabricating the semiconductor device may include: forming a first semiconductor substrate that includes a first diffusion barrier layer covering a first surface of a first semiconductor substrate body, and a first through via having a third surface exposed to a second surface of the first diffusion barrier layer; forming a second semiconductor substrate that includes a second diffusion barrier layer covering a fourth surface of a second semiconductor substrate body, and a front pad having a sixth surface exposed to a fifth surface of the second diffusion barrier layer, the sixth surface having a smaller surface area than the third surface of the first through via; and stacking the second semiconductor substrate on the first semiconductor substrate to directly bond a portion of the fifth surface of the second diffusion barrier layer to a second surface of the first diffusion barrier layer and directly bond the sixth surface of the front pad to a third surface of the first through via.

DETAILED DESCRIPTION

Figure 1:
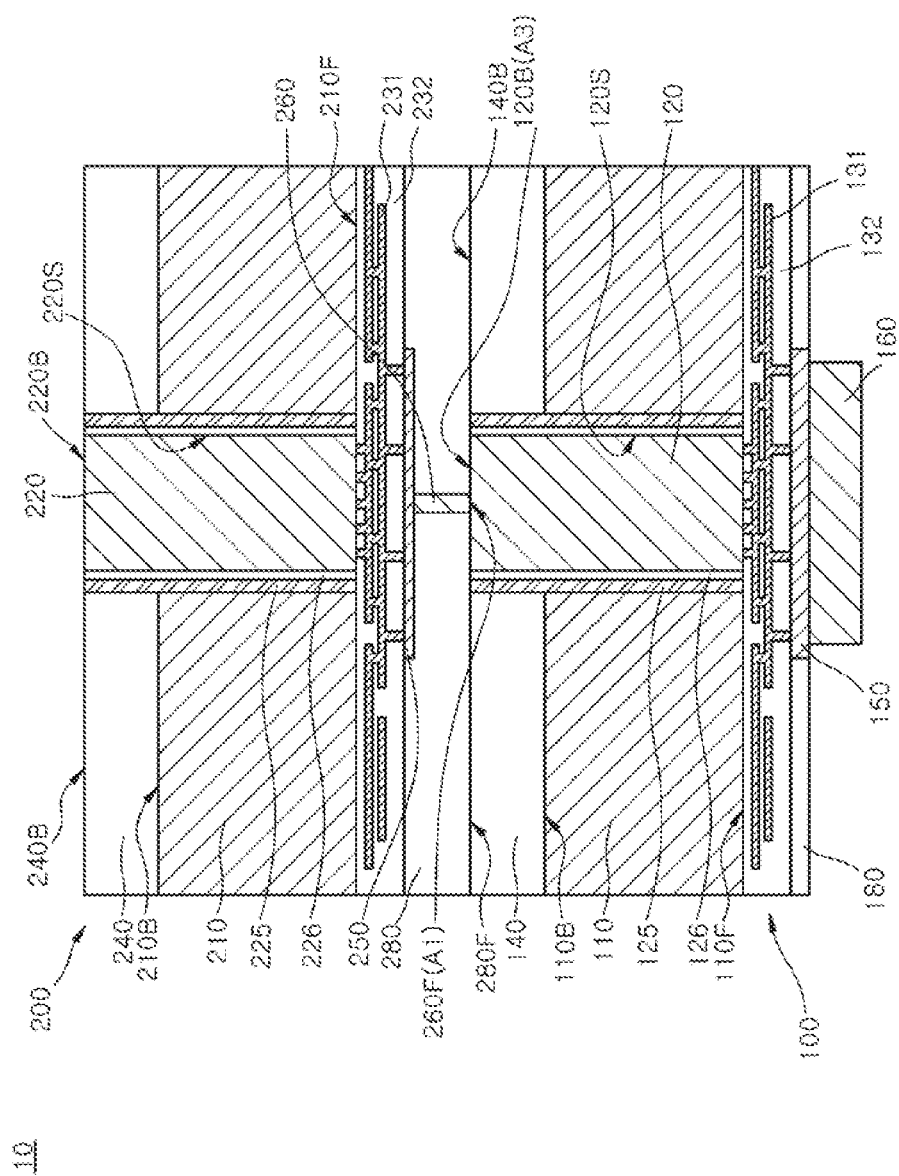
FIG. 1 is a cross-sectional view illustrating a semiconductor device according to an embodiment.

The terms used herein may correspond to words selected in consideration of their functions in presented embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third," etc. may be used herein to describe various elements, these elements should not be limited by these terms. These terms are only used to distinguish one element from another element, but not used to indicate a particular sequence or number of elements.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom," and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

Semiconductor packages, in accordance with various embodiments, may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips, application specific integrated circuits (ASIC) chips, application processors (APs), graphic processing units (GPUs), central processing units (CPUs) or system-on-chips (SoCs). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor packages may be employed in communication systems such as mobile phones, electronic systems associated with biotechnology or health care, or wearable electronic systems. The semiconductor packages may be applicable to internet of things (IoT).

Same reference numerals refer to same elements throughout the specification. Even though a reference numeral might not be mentioned or described with reference to a drawing, the reference numeral may be mentioned or described with reference to another drawing. In addition, even though a reference numeral might not be shown in a drawing, it may be shown in another drawing.

Figure 2:
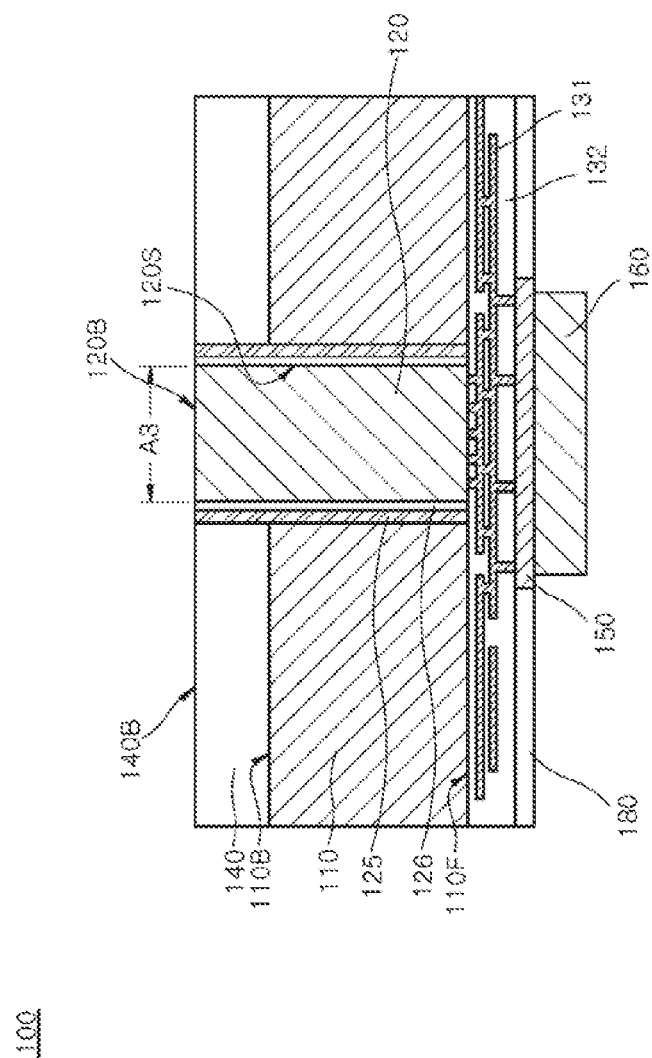
FIG. 2 is a cross-sectional view illustrating a first semiconductor substrate of the semiconductor device of FIG. 1.
Figure 3:
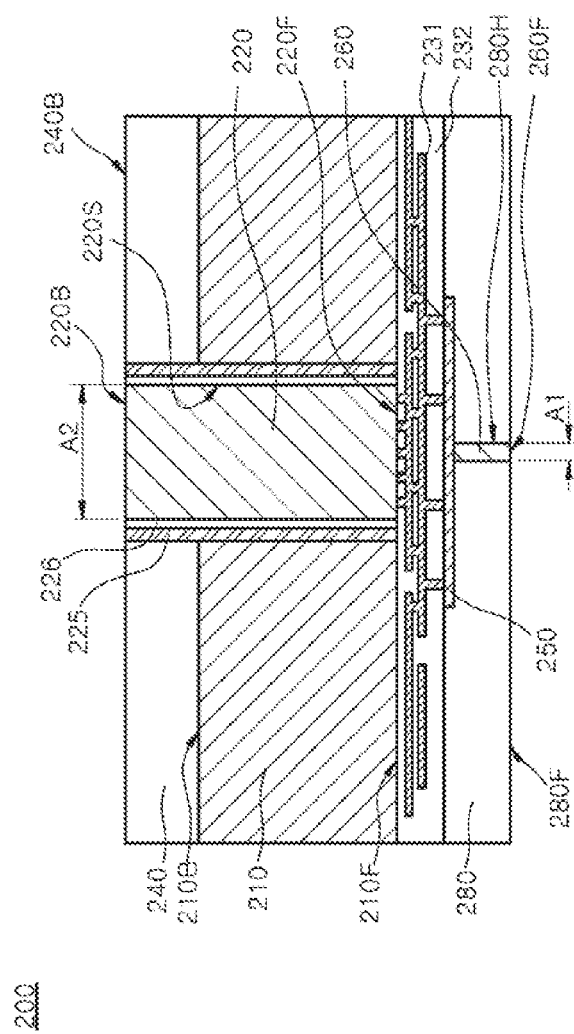
FIG. 3 is a cross-sectional view illustrating a second semiconductor substrate of the semiconductor device of FIG. 1.

FIG. 1 is a cross-sectional view illustrating a semiconductor device 10 according to an embodiment. FIG. 2 is a cross-sectional view illustrating a first semiconductor substrate of the semiconductor device of FIG. 1. FIG. 3 is a cross-sectional view illustrating a second semiconductor substrate 200 of the semiconductor device of FIG. 1.

Referring to FIG. 1, the semiconductor device 10 may include a first semiconductor substrate 100 and the second semiconductor substrate 200. The second semiconductor substrate 200 may be substantially vertically stacked on the first semiconductor substrate 100. The first semiconductor substrate 100 may have a shape of an individual semiconductor die separated from a semiconductor wafer.

The second semiconductor substrate 200 may have a shape of an individual semiconductor die separated from a semiconductor wafer. The second semiconductor device 10 may have a structure in which semiconductor dies or the semiconductor substrates 100 and 200 are three-dimensionally stacked. The semiconductor device 10 may have a structure in which other semiconductor substrates are placed over a semiconductor substrate at a wafer level. In another embodiment, each of the first and second semiconductor substrates 100 and 200 may have a semiconductor wafer shape.

The second semiconductor substrate 200 may be directly bonded to the first semiconductor substrate 100. The second semiconductor substrate 200 and the first semiconductor substrate 100 may be bonded to each other without intervening other separate members therebetween, as the opposing surfaces of the second semiconductor substrate 200 and the first semiconductor substrate 100 are in close contact with each other. A separate adhesive material or underfill material is not introduced onto the bonded interface where the second semiconductor substrate 200 is directly bonded to the first semiconductor substrate 100. Bonding the substrates directly in this way may indicate a method of hybrid bonding the substrates.

FIG. 2 is a cross-sectional view illustrating the first semiconductor substrate 100 of the semiconductor device 10 of FIG. 1.

Referring to FIGS. 2 and 1, the first semiconductor substrate 100 may include a first semiconductor substrate body 110, a first through via 120, and a first diffusion barrier layer 140. The first semiconductor substrate 100 may further include a second multilayer interconnection structure 131, a connection pad 150, and an outer connector 160. The first semiconductor substrate 100 may further include a first side barrier layer 126, and a first buffer layer 125.

The first semiconductor substrate body 110 may include silicon (Si) or other semiconductor materials. The first semiconductor substrate body 110 may include a first surface 110B and a seventh surface 110F facing each other up and down. The seventh surface 110F of the first semiconductor substrate body 110 may be a front side that provides an active region (not shown) in which integrated circuit elements are integrated. The first surface 110E of the first semiconductor substrate body 110 may be a back side located on the opposite side of the seventh surface 110F. An integrated circuit is not integrated on the first surface 110E of the first semiconductor substrate body 110.

The first diffusion barrier layer 140 may be disposed to cover the first surface 110B of the first semiconductor substrate body 110. The first diffusion barrier layer 140 may include a dielectric material or an insulating material. The first diffusion barrier layer 140 may include a diffusion barrier material capable of reducing or preventing diffusion of copper (Cu) ions against silicon oxide. The first diffusion barrier layer 140 may include a layer of silicon nitride ($Si_3N_4$). In an embodiment, the first diffusion barrier layer 140 may include a layer of silicon carbide (SiCN). Another dielectric layer may be further introduced between the first diffusion barrier layer 140 and the first surface 110B of the first semiconductor substrate body 110.

The first through via 120 may be introduced as a vertical connection element that substantially penetrates the first semiconductor substrate body 110 up and down. The first through via 120 may be introduced as a through silicon via (TSV) element. The first through via 120 may be disposed as a conductive pattern extending from the seventh surface 110F of the first semiconductor substrate body 110 to at least the first surface 110B. The first through via 120 may extend to protrude over the first surface 110E of the first semiconductor substrate body 110. The first through via 120 may further extend to substantially penetrate the first diffusion barrier layer 140.

A third surface 120B at the end of the first through via 120 may be exposed to a second surface 140B of the first diffusion barrier layer 140. The third surface 120B at the end of the first through via 120 and the second surface 140B of the first diffusion barrier layer 140 may have substantially the same surface level. The third surface 120B at the end of the first through via 120 and the second surface 140B of the first diffusion barrier layer 140 may provide globally planar surfaces that are connected to each other without having a step therebetween.

The first through via 120 may include copper (Cu) having lower electrical resistance than aluminum (Al) or polysilicon. The first side barrier layer 126 may be disposed to cover side surfaces 120S of the first through via 120. The first side barrier layer 126 may be introduced as a layer that effectively prevents diffusion of copper (Cu) ions from the side surfaces 120S of the first through via 120 to the first semiconductor substrate body 110. The first side barrier layer 126 may effectively prevent the first semiconductor substrate body 110 from being contaminated with copper (Cu) by isolating the first semiconductor substrate body 110 from the first through via 120.

The first buffer layer 125 may be disposed on a side of the first side barrier layer 126. The first buffer layer 125 may be disposed between the first diffusion barrier layer 140 and the first side barrier layer 126, and between the first semiconductor substrate body 110 and the first side barrier layer 126. The first side barrier layer 126 may be positioned between the first diffusion barrier layer 140 and the first through via 120 while substantially isolating the first semiconductor substrate body 110 from the first through via 120.

The first side barrier layer 126 may be formed of a diffusion barrier material preventing copper (Cu) ions of the first through via 120 from being diffused. The first side barrier layer 126 may include a layer of tantalum nitride (TaN). The first buffer layer 125 may be introduced as a layer that isolates the first side barrier layer 126 and the first semiconductor substrate body 110. The first buffer layer 125 may be introduced as a layer that relieves or reduces stress that may occur between the first side barrier layer 126 and the first semiconductor substrate body 110. The first buffer layer 125 may be introduced as a layer that relieves or reduces stress that may be involved between the first through via 120 and the first semiconductor substrate body 110. The first buffer layer 125 may include a layer of silicon oxide ($SiO_2$), such as tetraethylorthosilicate (TEOS).

The first semiconductor substrate 100 may further include the second multilayer interconnection structure 131 electrically connected to the first through via 120. The second multilayer interconnection structure 131 may be disposed over the seventh surface 110F of the first semiconductor substrate body 110. The second multilayer interconnection structure 131 may include a plurality of interconnection layers connected to each other. The second multilayer interconnection structure 131 may be positioned in the first dielectric layer 132 and may be insulated by the first dielectric layer 132. Some portions of the second multilayer interconnection structure 131 may be electrically connected to the first through via 120. Other portions of the second multilayer interconnection structure 131 may be electrically connected to integrated circuit elements (not shown) integrated over the seventh surface 110F of the first semiconductor substrate body 110.

The first semiconductor substrate 100 may further include the connection pad 150 disposed over the seventh surface 100F of the first semiconductor substrate body 110. The connection pad 150 may be disposed as a conductive pattern electrically connected to the second multilayer interconnection structure 131. The connection pad 150 may be disposed as a conductive pattern including a metal material such as aluminum (Al) or copper (Cu). A second dielectric layer 180 may be disposed to cover and protect the first dielectric layer 132 while exposing the connection pad 150. The second dielectric layer 180 may be introduced as a passivation layer.

The outer connector 160 may be connected to the connection pad 150. The outer connector 160 may be introduced as a connection element electrically connecting the semiconductor device 10 to another external electronic device or electronic module, or another printed circuit board (PCB). The outer connector 160 may be introduced as a connection element, such as a conductive bump or a solder ball.

FIG. 3 is a cross-sectional view illustrating a second semiconductor substrate 200 of the semiconductor device 10 of FIG. 1.

Referring to FIGS. 3 and 1, the second semiconductor substrate 200 may include a second semiconductor substrate body 210, a second diffusion barrier layer 280, and a front pad 260. The second semiconductor substrate 200 may further include a base pad 250, and a first multilayer interconnection structure 231. The second semiconductor substrate 200 may further include a second through via 220, a second side barrier layer 226, and a second buffer layer 225.

The second semiconductor substrate body 210 may be disposed on the first semiconductor substrate body 110. The second semiconductor substrate body 210 may include silicon (Si) or other semiconductor materials. The second semiconductor substrate body 210 may include a fourth surface 210F and a tenth surface 210B facing each other up and down. The fourth surface 210F of the second semiconductor substrate body 210 may be a front side providing an active region (not shown) in which integrated circuit elements (not shown) are integrated. The tenth surface 210B of the second semiconductor substrate body 210 may be a back side located on the opposite side of the fourth surface 210F. No integrated circuit is integrated on the tenth surface 110E of the second semiconductor substrate body 210.

The second diffusion barrier layer 280 may be disposed to cover the fourth surface 210F of the second semiconductor substrate body 210. The fourth surface 210F of the second semiconductor substrate body 210 may be a surface facing the first semiconductor substrate body 110. The second diffusion barrier layer 280 may be introduced as a layer facing the first diffusion barrier layer 140. The second diffusion barrier layer 280 may include a fifth surface 280F facing the second surface 140B of the first diffusion barrier 140. The fifth surface 280F or a portion of the fifth surface 280F of the second diffusion barrier layer 280 may be directly bonded to the second surface 140B of the first diffusion barrier layer 140. The second surface 140B of the first diffusion barrier layer 140 and the fifth surface 280F of the second diffusion barrier layer 280 may be surfaces bonded directly to each other by direct bonding. No adhesive layer or no other layers are interposed between the second surface 140B and the fifth surface 280F. For direct bonding, the second diffusion barrier layer 280 and the first diffusion barrier layer 140 may be introduced as layers of substantially the same dielectric material.

The second diffusion barrier layer 280 may include a dielectric material or an insulating material. The second diffusion barrier layer 280 may include a diffusion barrier material capable of reducing or preventing diffusion of copper (Cu) ions against silicon oxide. The second diffusion barrier layer 280 may include a layer of silicon nitride ($Si_3N_4$). In an embodiment, the second diffusion barrier layer 280 may include a layer of silicon carbide (SiCN). Another dielectric layer may be further introduced between the second diffusion barrier layer 280 and the fourth surface 210F of the second semiconductor substrate body 210.

The front pad 260 may be disposed to be exposed by the second diffusion barrier layer 280. The front pad 260 may be a conductive pattern having a sixth surface 260F exposed to the fifth surface 280F of the second diffusion barrier layer 280. The sixth surface 260F of the front pad 260 and the fifth surface 280F of the second diffusion barrier layer 280 may have substantially the same surface level. The sixth surface 260F of the front pad 260 and the fifth surface 280F of the second diffusion barrier layer 280 may provide globally planar surfaces that are connected to each other without having a step therebetween.

The front pad 260 may be a conductive pattern that substantially penetrates the second diffusion barrier layer 280 vertically. The sixth surface 260F of the front pad 260 may be directly bonded to the third surface 120B of the first through via 120 of the first semiconductor substrate 100. The sixth surface 260F of the front pad 260 and the third surface 120B of the first through via 120 may be surfaces bonded directly to each other by direct bonding. No adhesive layer or no other layers are interposed between the sixth surface 260F of the front pad 260 and the third surface 120B of the first through via 120. In order for the sixth surface 260F of the front pad 260 and the third surface 120B of the first through via 120 to be directly bonded and coupled to each other, the front pad 260 and the first through via 120 may include substantially the same conductive material. The front pad 260 and the first through via 120 may both include a conductive layer including copper (Cu).

In order to increase the probability that the front pad 260 will be located within the region of the third surface 120B without leaving the region of the third surface 120B of the first through via 120, the surface area A1 of the sixth surface 260F of the front pad 260 may be smaller than the surface area A3 of the third surface 120B of the first through via 120. The front pad 260 may be formed as a conductive pattern having a diameter smaller than the diameter of the first through via 120. Accordingly, it is possible to improve a margin that the front pad 260 can be located within the region of the third surface 120B of the first through via 120 without leaving the region of the third surface 120B of the first through via 120 when the second semiconductor substrate 200 is vertically stacked on the first semiconductor substrate 100. It may be possible to improve the alignment margin that the second semiconductor substrate 200 is to be aligned with respect to the first semiconductor substrate 100. The surface area A1 of the sixth surface 260F of the front pad 260 is smaller than the surface area A3 of the third surface 120B of the first through via 120, so that some portions of the second diffusion barrier layer 280 can be extended to cover the portions of the third surface 120B of the first through via 120, exposed outside the sixth surface 260F of the front pad 260. Accordingly, the diffusion of copper (Cu) ions from the portions of the third surface 120B of the first through via 120 exposed outside the sixth surface 260F of the front pad 260 to other regions can be effectively blocked or prevented by the covering portion of the second diffusion barrier layer 280.

The front pad 260 may be connected to the base pad 250. The base pad 250 may be introduced as a conductive pattern that supports the front pad 260. The base pad 250 may be a conductive pattern having a greater line width than the front pad 260. The base pad 250 may include the same conductive material as the front pad 260. The base pad 250 may include a metal pad including copper (Cu). The base pad 250 may be a metal pad including aluminum (Al).

The first multilayer interconnection structure 231 may be electrically connected to the base pad 250. The first multilayer interconnection structure 231 may be disposed over the fourth surface 210F of the second semiconductor substrate body 210. The first multilayer interconnection structure 231 may include a plurality of interconnection layers connected to each other. The first multilayer interconnection structure 231 may be located in the second dielectric layer 232 and may be isolated by the second dielectric layer 232. Some portions of the first multilayer interconnection structure 231 may be electrically connected to integrated circuit elements (not shown) integrated over the fourth surface 210F of the second semiconductor substrate body 210.

Other portions of the first multilayer interconnection structure 231 may be electrically connected to the second through via 220.

The second through via 220 may be introduced as a vertical connection element that substantially penetrates the second semiconductor substrate body 210 vertically. The second through via 220 may be introduced as a through silicon via (TSV) element. The second through via 220 may be disposed as a conductive pattern extending from the fourth surface 210F of the second semiconductor substrate body 210 to at least the tenth surface 210B. The second through via 220 may be extended to protrude over the tenth surface 210B of the second semiconductor substrate body 210. The second through via 220 may be further extended to substantially penetrate the third diffusion barrier layer 240 vertically. The eighth surface 220B at the end of the second through via 220 may be exposed to the eleventh surface 240B of the third diffusion barrier layer 240. The surface area A2 of the eighth surface 220B at the end of the second through via 220 may be greater than the surface area A1 of the front pad 260. The surface area A2 of the eighth surface 220B at the end of the second through via 220 may be substantially the same as the surface area A3 of the third surface 120B of the first through via 120 in FIG. 2.

The third diffusion barrier layer 240 may be disposed to cover the tenth surface 210B of the second semiconductor substrate body 210. The third diffusion barrier layer 240 may be disposed as a layer including a dielectric material or an insulating material. The third diffusion barrier layer 240 may include a diffusion barrier material capable of reducing or preventing diffusion of copper (Cu) ions against silicon oxide. The third diffusion barrier layer 240 may include a layer of silicon nitride ($Si_3N_4$). In an embodiment, the third diffusion barrier layer 240 may include a layer of silicon carbide (SiCN).

The second through via 220 may include copper (Cu) having lower electrical resistance than aluminum (Al) or polysilicon. The second side barrier layer 226 may be disposed to cover the side surfaces 220S of the second through via 220. The second side barrier layer 226 may be introduced as a layer that effectively prevents diffusion of copper (Cu) ions from the side surfaces 220S of the second through via 220 to the second semiconductor substrate body 210. The second buffer layer 225 may be disposed on the side surface of the second side barrier layer 226. The second side barrier layer 226 may be formed of a diffusion barrier material that prevents diffusion of copper (Cu) ions of the second through via 220. The second side barrier layer 226 may include a layer of tantalum nitride (TaN). The first buffer layer 225 may include a layer of silicon oxide ($SiO_2$), such as tetraethylorthosilicate (TEOS).

Figure 4:
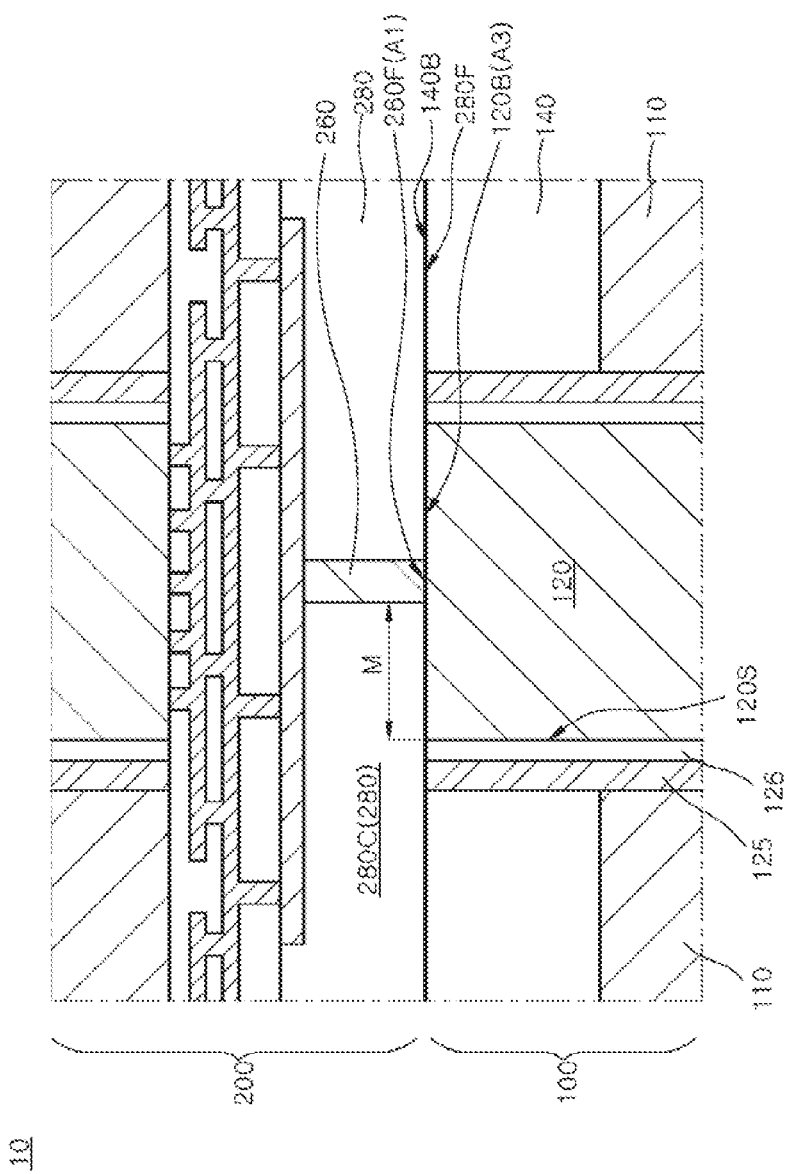
FIG. 4 is a cross-sectional view illustrating an enlarged bonding structure of a first through via and a front bump of FIG. 1.
Figure 5:
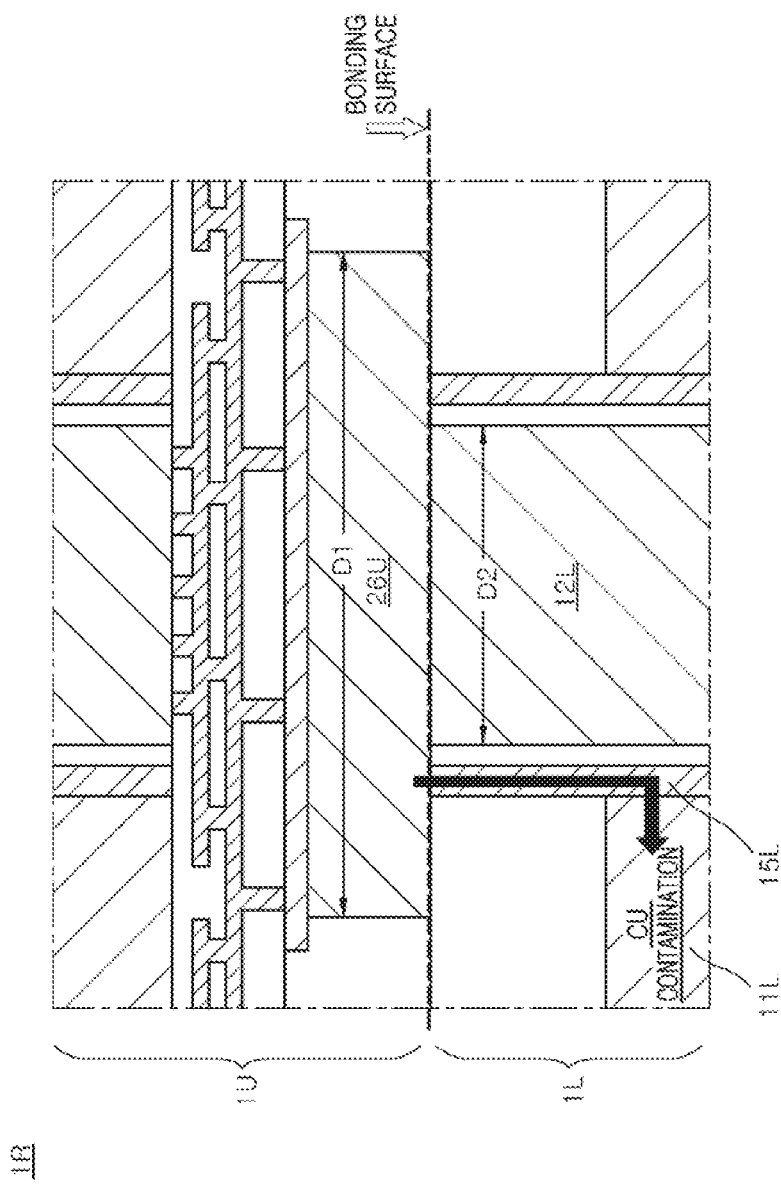
FIG. 5 is a cross-sectional view illustrating copper contamination in a bonding structure of a through via and a bump according to a comparative example.

FIG. 4 is a cross-sectional view illustrating an enlarged bonding structure of the first through via 120 and the front bump 260 of FIG. 1. FIG. 5 is a cross-sectional view illustrating copper contamination in a bonding structure 1R of a through via 12L and a bump 26U according to a comparative example.

Referring to FIG. 4, the second semiconductor substrate 200 may be directly bonded to the first semiconductor substrate 100 while being stacked on the first semiconductor substrate 100. The surface area A3 of the third surface 120B of the first through via 120 is smaller than the surface area A1 of the sixth surface 260F of the front bump 260, so that the alignment margin M of the front bump 260 with respect to the first through via 120 can be improved depending on the difference between the diameter of the first through via 120 and the diameter of the front bump 260. The greater the difference between the surface area A3 of the third surface 120B of the first through via 120 and the surface area A1 of the sixth surface 260F of the front bump 260, the greater the difference between the diameter of the first through via 120 and the diameter of the front bump 260, and the alignment margin M of the front bump with respect to the first through via can be increased. The greater the alignment margin M, the higher the probability that the front bump 260 will be located within the third surface 120B of the first through via 120. As the alignment margin M increases, the possibility that the front bump 260 overlaps the first buffer layer 125 out of the third surface 120B of the first through via 120 can decrease.

In the bonding structure 1R of the through via 12L and the bump 26U according to the comparative example of FIG. 5, the diameter D1 of the bump 26U of an upper semiconductor substrate 1U is greater than the diameter D2 of the through via 12L of a lower semiconductor substrate 1L. In this case, the bump 26U of the upper semiconductor substrate 1U may overlap the buffer layer 15L of the lower semiconductor substrate 1L. When the bump 26U is formed of copper (Cu), copper (Cu) ions may be diffused from the bump 26U to the lower semiconductor substrate body 111 through the silicon oxide of the buffer layer 15L. Due to the diffusion of copper (Cu) ions, the lower semiconductor substrate body 11L may be contaminated with copper (Cu) ions.

On the other hand, in the bonding structure of the first through via 120 and the front bump 260 of FIG. 4, the front bump 260 has a smaller diameter than the first through via 120 so that the front bump 260 can be located within the third surface 120B of the first through via 120. Accordingly, it may be possible to reduce the possibility that the front bump 260 overlaps the first buffer layer 125, thereby reducing or blocking the diffusion of copper (Cu) ions from the front bump 260 containing copper (Cu) to the first semiconductor substrate body 110. Accordingly, it may be possible to effectively suppress, prevent, or reduce the occurrence of copper (Cu) contamination in the first semiconductor substrate body 110.

The front bump 260 may have a diameter of ½ to ⅙ times the diameter of the first through via 120. The surface area A1 of the sixth surface 260F of the front bump 260 is ¼ to ⅟₃₆ times the surface area A3 of the third surface 120B of the first through via 120, The front bump 260 may have a diameter of approximately 1.0 μm to 2.0 μm, while the first through via 120 may have a diameter of 4.0 μm to 6.0 μm.

Figure 6:
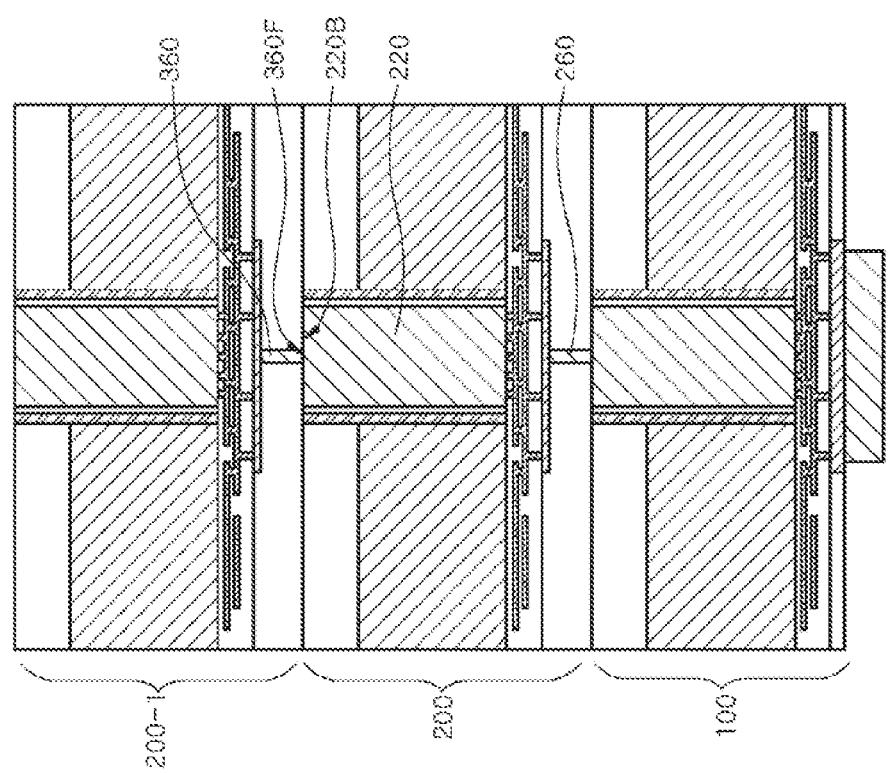
FIG. 6 is a cross-sectional view illustrating a semiconductor device according to an embodiment.

FIG. 6 is a cross-sectional view illustrating a semiconductor device 30 according to an embodiment.

Referring to FIG. 6 with FIGS. 4 and 5 together, the semiconductor device 30 may include a structure in which a third semiconductor substrate 200-1 is directly bonded to a structure in which the second semiconductor substrate 200 is directly bonded to the first semiconductor substrate 100. The structure in which the second semiconductor substrate 200 is directly bonded to the first semiconductor substrate 100 may have a structure substantially the same as the semiconductor device 10 of FIG. 1. The third semiconductor substrate 200-1 may have substantially the same structure as the second semiconductor substrate 200 described with reference to FIGS. 1 and 3.

The third semiconductor substrate 200-1 may include another front pad 360 corresponding to the front pad 260 of the second semiconductor substrate 200. A ninth surface 360F of the front pad 360 of the third semiconductor substrate 200-1 may be directly bonded to the eighth surface 220B at the end of the second through via 220.

FIGS. 7 to 10 are cross-sectional views illustrating process steps of a method of fabricating the semiconductor device 10 of FIG. 1.

Figure 7:
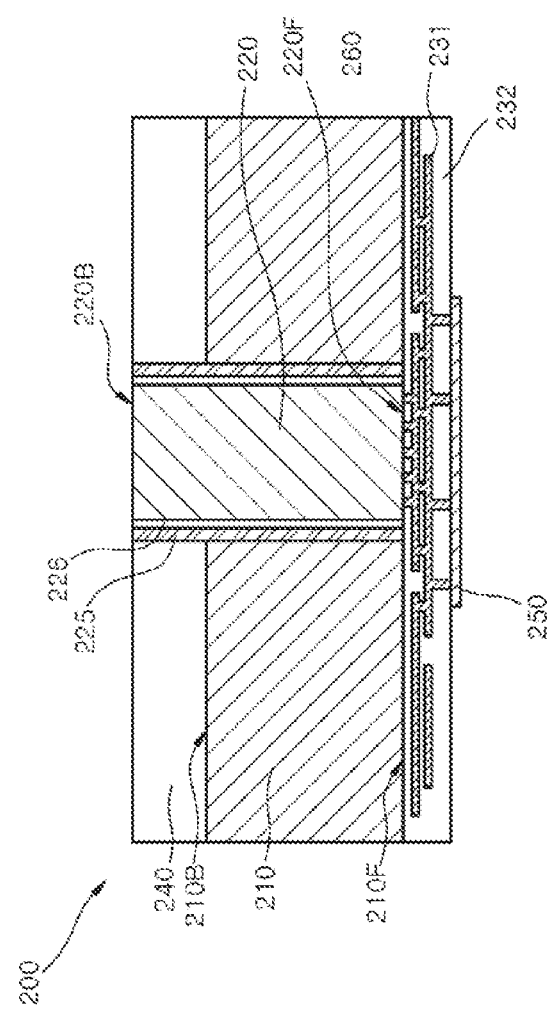
FIGS. 7 to 10 are cross-sectional views illustrating process steps of a method of fabricating the semiconductor device of FIG. 1.

Referring to FIG. 7, the first multilayer interconnection structure 231 may be formed over the fourth surface 210F of the second semiconductor substrate body 210 of the second semiconductor substrate 200. The base pad 250 may be formed to be connected to the first multilayer interconnection structure 231. The second through via 220 may be provided in the second semiconductor substrate body 210.

Figure 8:
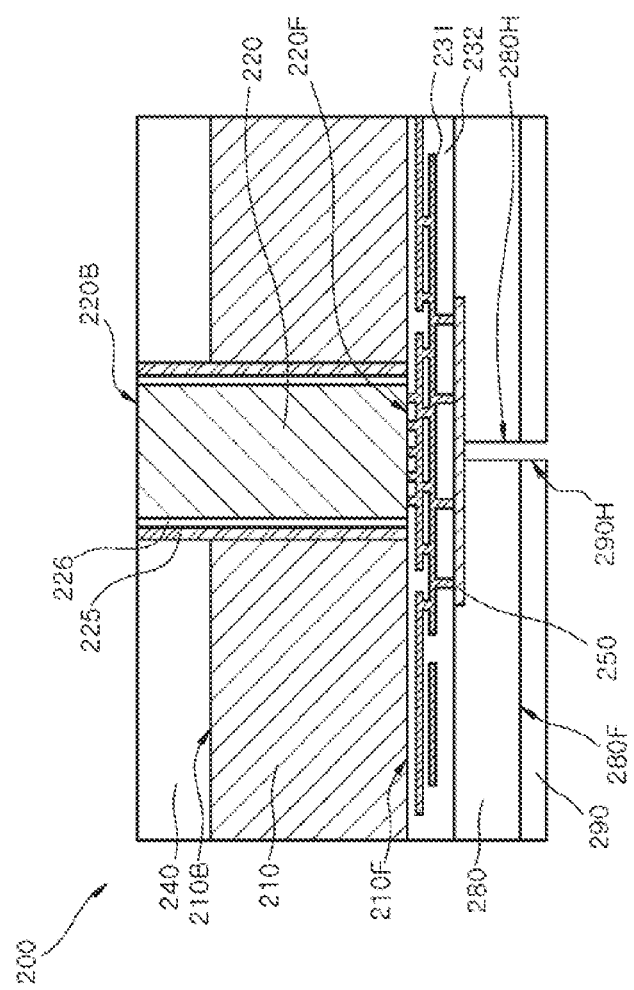

Referring to FIG. 8, the second diffusion barrier layer 280 may be formed to cover the fourth surface 210F of the second semiconductor substrate body 210. The second diffusion barrier layer 280 may be formed to cover the second dielectric layer 232 that insulates the first multilayer interconnection structure 231. A resist pattern 290 may be formed on the fifth surface 280F of the second diffusion barrier layer 280. The resist pattern 290 may have an opening 290H of a through hole shape in a portion where the front bump (260 in FIG. 1) is to be located. The resist pattern 290 may be formed by applying, exposing, and developing a photoresist layer.

A portion of the second diffusion barrier layer 280 exposed by the resist pattern 290 may be selectively removed to form a damascene hole 280H. A selective etching process using the resist pattern 290 as an etch mask may be performed to form the damascene hole 280H in the second diffusion barrier layer 280.

Figure 9:
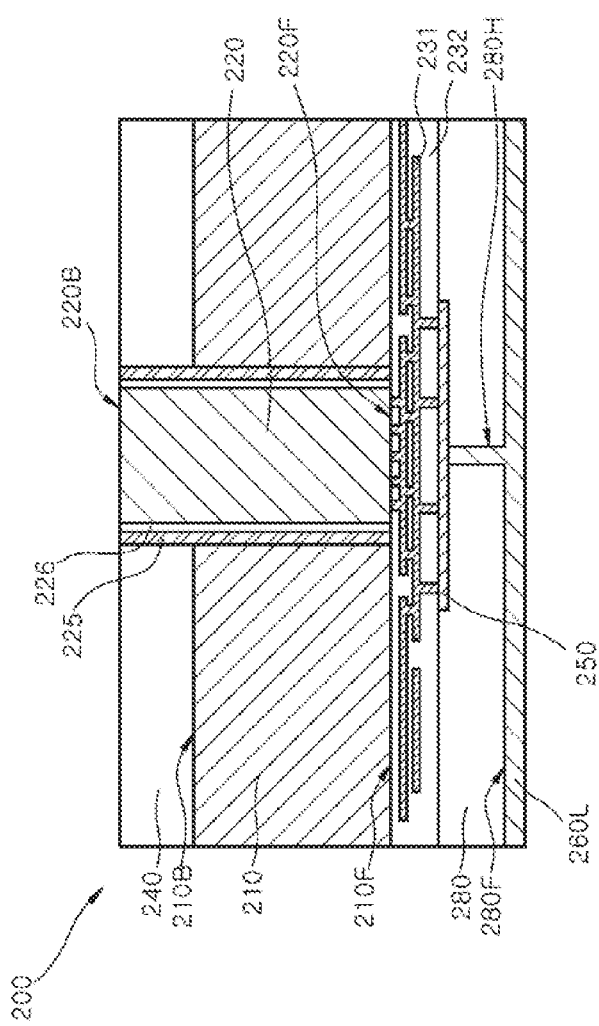

Referring to FIG. 9, a conductive layer 260L may be formed to fill the damascene hole 280H. The conductive layer 260L may be formed by a copper (Cu) plating process. The conductive layer 260L may be partially removed to a certain thickness so that a portion of the conductive layer remains in the damascene hole 280H. In an embodiment, the conductive layer 260L may be partially removed to a predetermined thickness so that a portion of the conductive layer remains in the damascene hole 280H. The remaining portion of the conductive layer may be patterned into the front pad (260 of FIG. 3). The front pad (260 of FIG. 3) may be patterned as a conductive pattern located within the damascene hole (280H in FIG. 3). The word "predetermined" as used herein with respect to a parameter, such as a predetermined thickness, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 10:
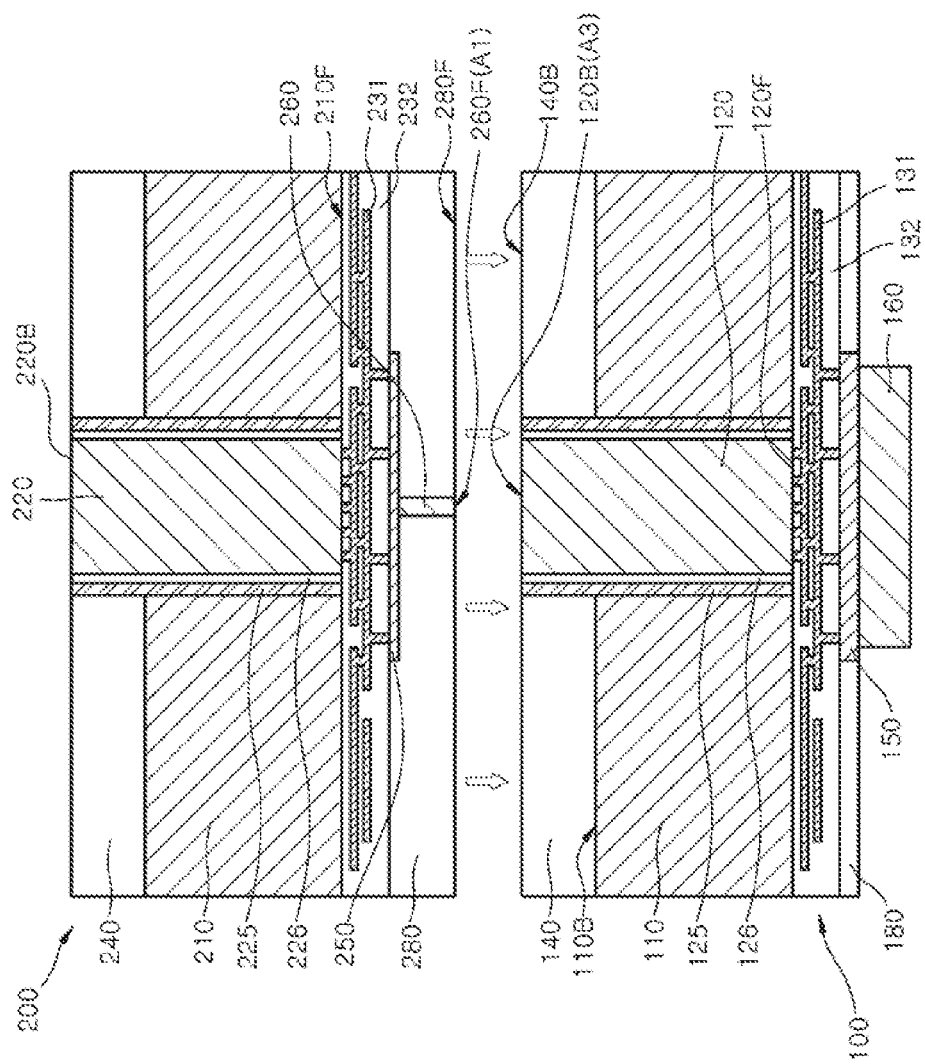

Referring to FIG. 10, the second semiconductor substrate 200 may be formed to include the second diffusion barrier layer 280 substantially covering the fourth surface 210F of the second semiconductor substrate body 210, and the front pad 260, where the sixth surface 260F exposed to the fifth surface 280F of the second diffusion barrier layer 280 has a smaller surface area A1 than the third surface 120B of the first through via 120.

The first semiconductor substrate 100 may be formed to include the first diffusion barrier layer 140 covering the first surface 110S of the first semiconductor substrate body 110, and the first through via 120, where the third surface 120B is exposed to the second surface 140B of the first diffusion barrier layer 140.

The second semiconductor substrate 200 may be stacked on the first semiconductor substrate 100, While directly bonding a portion of the fifth surface 280F of the second diffusion barrier layer 280 to the second surface 140B of the first diffusion barrier layer 140, the sixth surface 260F of the front pad 260 may be directly bonded to the third surface 120B of the first through via 120. Accordingly, as the first semiconductor substrate 100 and the second semiconductor substrate 200 are directly bonded, the semiconductor device 10 including the stack of the first semiconductor substrate 100 and the second semiconductor substrate 200 may be implemented.

Figure 11:
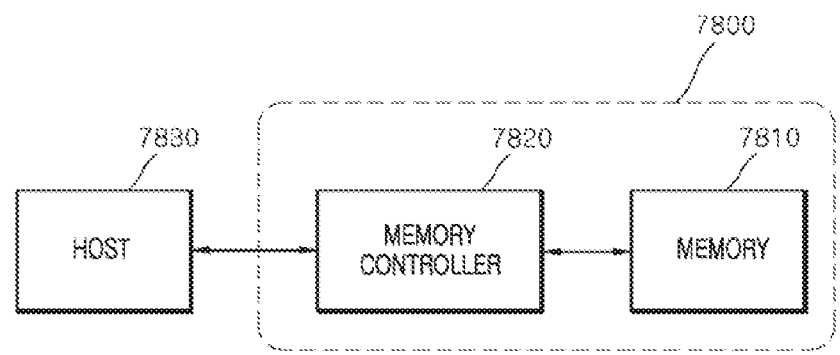
FIG. 11 is a block diagram illustrating an electronic system employing a memory card including a package in accordance with an embodiment.

FIG. 11 is a block diagram illustrating an electronic system including a memory card 7800 employing at least one of the semiconductor packages according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 12:
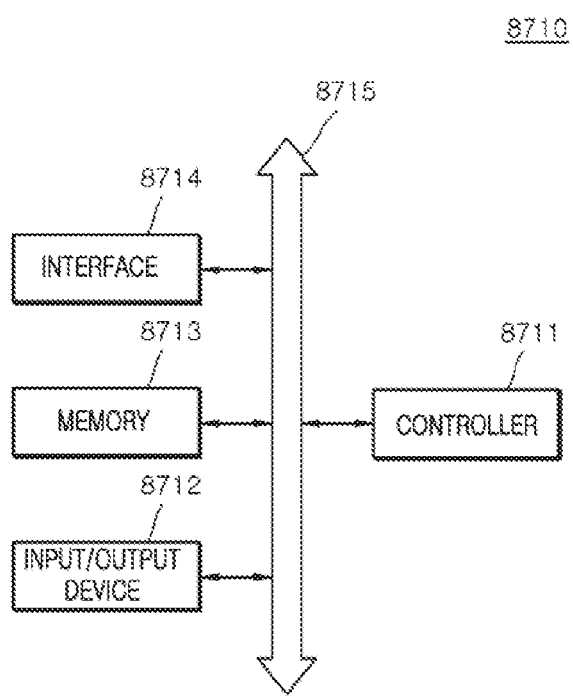
FIG. 12 is a block diagram illustrating an electronic system including a package according to an embodiment.

FIG. 12 is a block diagram illustrating an electronic system 8710 including at least one of the semiconductor packages according to the embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid-state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

The concepts have been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the concepts are not limited to the above descriptions but defined by the accompanying claims, and all of distinctive features in the equivalent scope should be construed as being included in the concepts.

What is claimed is:

1. A semiconductor device comprising:
   a first semiconductor substrate; and
   a second semiconductor substrate vertically stacked on the first semiconductor substrate, wherein the first semiconductor substrate comprises:
a first semiconductor substrate body;
a first diffusion barrier layer covering a first surface of the first semiconductor substrate body; and
a first through via having a third surface exposed to a second surface of the first diffusion barrier layer,
wherein the second semiconductor substrate comprises:
a second semiconductor substrate body disposed on the first semiconductor substrate body;
a second diffusion barrier layer covering a fourth surface of the second semiconductor substrate body facing the first semiconductor substrate body, a portion of a fifth surface of the second diffusion barrier layer being directly bonded to the second surface of the first diffusion barrier layer; and
a front pad having a sixth surface exposed to the fifth surface of the second diffusion barrier layer, the sixth surface having a smaller surface area than the third surface of the first through via and being directly bonded to the third surface of the first through via of the first semiconductor substrate.

2. The semiconductor device of claim 1, wherein some portions of the second diffusion barrier layer extend to cover a portion of the third surface of the first through via, exposed outside the sixth surface of the front pad.

3. The semiconductor device of claim 1, wherein the first through via extends to penetrate the first diffusion barrier layer and the first semiconductor substrate body.

4. The semiconductor device of claim 2, further comprising:
a first side barrier layer covering a side surface of the first through via; and
a first buffer layer disposed between the first diffusion barrier layer and the first side barrier layer and between the first semiconductor substrate body and the first side barrier layer.

5. The semiconductor device of claim 4, wherein the first through via comprises copper (Cu), the first side barrier layer comprises tantalum nitride (Ta N), and the first buffer layer comprises silicon oxide ($SiO_2$).

6. The semiconductor device of claim 1, wherein the first diffusion barrier layer comprises at least one of silicon nitride ($Si_3N_4$) and silicon carbide (SiCN).

7. The semiconductor device of claim 1, wherein the second diffusion barrier layer comprises at least one of silicon nitride ($Si_3N_4$) and silicon carbide (SiCN).

8. The semiconductor device of claim 1, wherein the front pad comprises copper (Cu).

9. The semiconductor device of claim 1, further comprising a base pad to which the front pad is connected,
wherein the base pad is wider than the front pad.

10. The semiconductor device of claim 9, wherein the base pad comprises substantially the same material as the front pad.

11. The semiconductor device of claim 9, wherein the base pad comprises at least one of copper (Cu) and aluminum (Al).

12. The semiconductor device of claim 9, further comprising a first multilayer interconnection structure electrically connected to the base pad.

13. The semiconductor device of claim 1, further comprising:
a second multilayer interconnection structure disposed on a seventh surface opposite to the first surface of the first semiconductor substrate body and electrically connected to the first through via;
a connection pad connected to the second multilayer interconnection structure; and
an outer connector connected to the connection pad.

14. A semiconductor device comprising:
a first semiconductor substrate; and
a second semiconductor substrate vertically stacked on the first semiconductor substrate,
wherein the first semiconductor substrate comprises:
a first semiconductor substrate body;
a first diffusion barrier layer covering a first surface of the first semiconductor substrate body; and
a first through via having a third surface exposed to a second surface of the first diffusion barrier layer,
wherein the second semiconductor substrate comprises:
a second semiconductor substrate body disposed on the first semiconductor substrate body;
a second diffusion barrier layer covering a fourth surface of the second semiconductor substrate body facing the first semiconductor substrate body, a portion of a fifth surface of the second diffusion barrier layer being directly bonded to the second surface of the first diffusion barrier layer;
a front pad having a sixth surface exposed to the fifth surface of the second diffusion barrier layer, the sixth surface having a smaller surface area than the third surface of the first through via and being directly bonded to the third surface of the first through via of the first semiconductor substrate; and
a second through via electrically connected to the front pad and penetrating the second semiconductor substrate body.

15. The semiconductor device of claim 14, further comprising:
a base pad to which the front pad is connected, the base pad being wider than the front pad;
a first multilayer interconnection structure electrically connected to the base pad,
wherein the second through via is electrically connected to the first multilayer interconnection structure.

16. The semiconductor device of claim 15, further comprising a third semiconductor substrate including another front pad having a ninth surface directly bonded to an eighth surface at an end of the second through via.

17. The semiconductor device of claim 14, further comprising:
a second multilayer interconnection structure disposed on a seventh surface opposite to the first surface of the first semiconductor substrate body and electrically connected to the first through via;
a connection pad connected to the second multilayer interconnection structure; and
an outer connector connected to the connection pad.

18. The semiconductor device of claim 14, wherein a portion of the second diffusion barrier layer extends to cover a portion of the third surface of the first through via, exposed to the sixth surface of the front pad.

19. A method of fabricating a semiconductor device, the method comprising:
forming a first semiconductor substrate that includes a first diffusion barrier layer covering a first surface of a first semiconductor substrate body, and a first through via having a third surface exposed to a second surface of the first diffusion barrier layer;
forming a second semiconductor substrate that includes a second diffusion barrier layer covering a fourth surface of a second semiconductor substrate body, and a front pad having a sixth surface exposed to a fifth surface of the second diffusion barrier layer, the sixth surface having a smaller surface area than the third surface of the first through via; and stacking the second semiconductor substrate on the first semiconductor substrate to directly bond a portion of the fifth surface of the second diffusion barrier layer to a second surface of the first diffusion barrier layer and directly bond the sixth surface of the front pad to a third surface of the first through via.

20. The method of claim 19, wherein the front pad is formed by:

forming a resist pattern on the fifth surface of the second diffusion barrier layer;

selectively removing a portion of the second diffusion barrier layer, exposed by the resist pattern to form a damascene hole;

forming a conductive layer to fill the damascene hole; and removing the conductive layer by a predetermined thickness to pattern the front pad located in the damascene hole.

* * * * *